United States Patent
Krassnitzer et al.

(10) Patent No.: US 11,578,401 B2
(45) Date of Patent: Feb. 14, 2023

(54) ARC SOURCE WITH CONFINED MAGNETIC FIELD

(71) Applicant: Oerlikon Surface Solutions AG, Pfäffikon, Pfäffikon (CH)

(72) Inventors: Siegfried Krassnitzer, Feldkirch (AT); Juerg Hagmann, Sax (CH)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 0 days.

(21) Appl. No.: 16/753,565

(22) PCT Filed: Oct. 4, 2018

(86) PCT No.: PCT/EP2018/000459
§ 371 (c)(1),
(2) Date: Apr. 3, 2020

(87) PCT Pub. No.: WO2019/081052
PCT Pub. Date: May 2, 2019

(65) Prior Publication Data
US 2020/0299824 A1 Sep. 24, 2020

Related U.S. Application Data

(60) Provisional application No. 62/567,423, filed on Oct. 3, 2017.

(51) Int. Cl.
*C23C 14/32* (2006.01)
*C23C 14/06* (2006.01)
(Continued)

(52) U.S. Cl.
CPC ........ *C23C 14/325* (2013.01); *C23C 14/0641* (2013.01); *C23C 14/243* (2013.01);
(Continued)

(58) Field of Classification Search
None
See application file for complete search history.

(56) References Cited

U.S. PATENT DOCUMENTS 4,448,659 A * 5/1984 Morrison, Jr. .... H01J 37/32055
204/192.38
4,724,058 A * 2/1988 Morrison, Jr. ........ C23C 14/325
204/192.38
(Continued)

FOREIGN PATENT DOCUMENTS

CN   101358328 A   2/2009
RU   2074904 C1   3/1997
(Continued)

OTHER PUBLICATIONS

GOST11036-75 "Electrotechnical quality unalloyed steel. Specifications." GOST 11036-75 (Unified Database of Standards of the Russian Federation—This standard applies to electrical non-alloyed hot-rolled forged and calibrated steel used in the magnetic circuits of electrical apparatus and appliances.); first published Jan 1, 1977; most recent edition Jun. 1, 2003, pp. 134-138, Mincherment USSR.

*Primary Examiner* — Jason Berman

(57) ABSTRACT

An ARC evaporator comprising: a cathode assembly comprising a cooling plate (11), a target (1) as cathode element, an electrode arranged for enabling that an arc between the electrode and the front surface (1A) of the target (1) can be established—a magnetic guidance system placed in front of the back surface (1 B) of the target (i) comprising means for generating one or more magnetic whereas: —the borders of the cathode assembly comprise a surrounding shield (15) made of ferromagnetic material, wherein the surrounding shield (15) has a total height (H) in the transversal direction, said total height (H) including a component (C) for causing a shielding effect of magnetic field lines extending in any longitudinal directions, establishing in this manner the bor-
(Continued)

ders of the cathode assembly as limit of the extension of the magnetic field lines in any longitudinal direction.

9 Claims, 9 Drawing Sheets

(51) Int. Cl.
*C23C 14/24* (2006.01)
*C23C 14/54* (2006.01)
*H01J 37/32* (2006.01)

(52) U.S. Cl.
CPC ........ *C23C 14/54* (2013.01); *H01J 37/32055* (2013.01); *H01J 37/3255* (2013.01); *H01J 37/3266* (2013.01); *H01J 37/32541* (2013.01); *H01J 37/32559* (2013.01); *H01J 37/32669* (2013.01); *H01J 2237/152* (2013.01); *H01J 2237/332* (2013.01)

(56) References Cited

U.S. PATENT DOCUMENTS

| | | | |
|---|---|---|---|
| 5,298,136 | A | 3/1994 | Ramalingam |
| 9,153,422 | B2 * | 10/2015 | Warzyszynski ..... H01J 37/3452 |
| 2004/0154919 | A1 | 8/2004 | Curtins |
| 2009/0050059 | A1 * | 2/2009 | Goikoetxea Larrinaga ................ C23C 14/243 118/726 |

FOREIGN PATENT DOCUMENTS

| | | |
|---|---|---|
| RU | 2135634 C1 | 8/1999 |
| RU | 2482217 C1 | 5/2013 |
| RU | 2536126 C2 | 12/2014 |

\* cited by examiner

Magnetic field in axisymmetric configuration scope of magnet adjustability

| unipolar | bipolar | focused |

6a

6b

ARC SOURCE WITH CONFINED MAGNETIC FIELD

The present invention relates to a new ARC source comprising a confined magnetic field.

The inventive ARC source comprises a cathode material to be vaporized in order to produce coating material for depositing a coating film on a substrate surface to be coated and an especial shielding, which allows a considerable increment of efficiency during coating in comparison with known ARC sources belonging to the state of the art.

Hereafter also the term target will be used for referring to the cathode material to be vaporized.

In the context of the present invention the term ARC source is used for referring to an arc evaporator that comprises a target to be operated as cathode material to be evaporated by effect of an arc discharge.

TECHNICAL FIELD OF THE INVENTION

The present invention belongs to the field of arc evaporators and, more specifically, to the field of arc evaporators including means for causing a guidance of the arc trajectory by generation of a magnetic field.

STATE OF THE ART

The arc evaporator machines usually comprise, in addition to the chamber itself, at least one electrode and one cathode between which an electric arc is established. To prevent or reduce the random nature of the movement of the arc for the purpose of controlling erosion of the cathode surface being evaporated and reducing droplets formation, control or magnetic guidance systems for controlling the movement of the arc have been developed. These guidance systems form and modify magnetic fields affecting the movements of the electric arc. There are several publications of patents or patent applications that describe different systems of this type.

Goikoetxea Larrinaga describes for example an arc evaporator including a magnetic guidance system in the US patent application having application Ser. No. 12/097,28. In this document it is explained the magnetic guidance system is designed for allowing control of the cathode arc and for moving the cathode arc over a broad area of the cathode plate. More specifically, the magnetic guidance system should allow guidance of the cathode point (also referred to as cathode spot). The cathode point should be understood as the point of impact of the arc on the cathode. By using the magnetic guidance system, the cathode point should be guided according to a path chosen individually from among a practically infinite number of possible paths. The magnetic guidance system is designed to be placed completely outside the evaporation chamber. This arc evaporator comprises an evaporation target (a circular evaporator target with a diameter of 100 mm) used as cathode element, a ferromagnetic core designed forming a support and a magnetic device for generating magnetic fields. The magnetic device comprises a central pole and a peripheral pole, as well means for generating a first magnetic field and means for generating a second magnetic field, so that respective magnetic field components contribute to a total magnetic field in correspondence with the cathode element.

DISADVANTAGES OF THE STATE OF THE ART

Using currently available ARC sources (i.e. arc evaporators) involves the disadvantage that if two or more ARC sources are placed one beside to another within a coating chamber, then magnetic fields generated for guiding the arc trajectory and consequently for controlling the cathode spot path at the target surface in an ARC source result in disturbance to other magnetic fields corresponding to other ARC sources placed beside to, which can even result in a reciprocal disturbance between magnetic fields of the different ARC sources placed one beside to the each other.

OBJECTIVE OF THE PRESENT INVENTION

Figure 1:
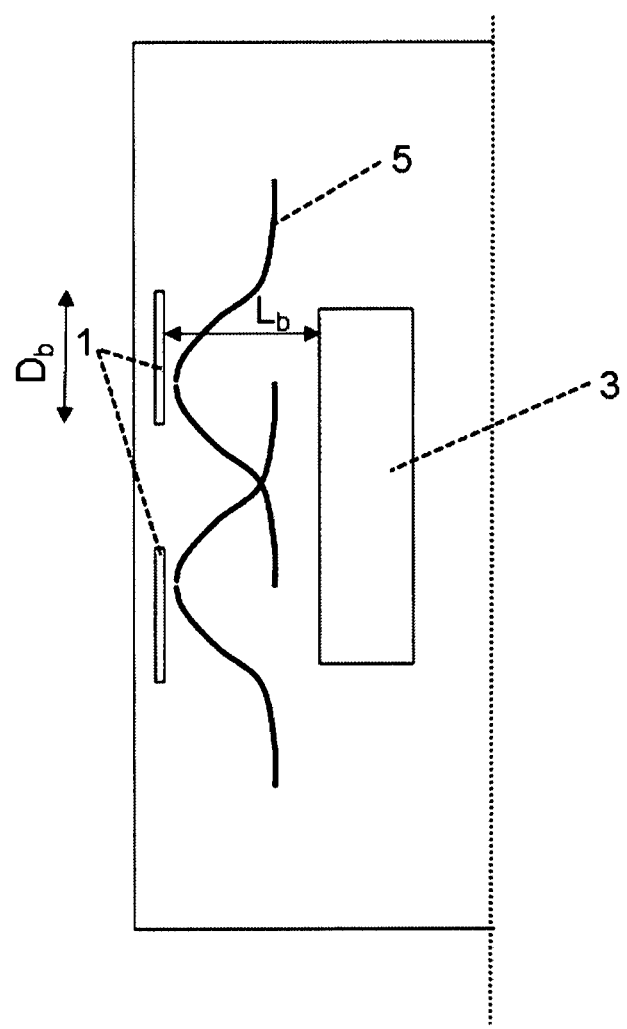
FIG. 1 and FIG. 2 show two different configurations of coating chambers.

In view of the above-mentioned deficiencies of ARC sources according to the state of the art, the main objective of the present invention is to provide a new ARC source with an alternative configuration that allows implementing ARC sources arrangements with more closely spaced ARC sources in a coating chamber.

DESCRIPTION OF THE PRESENT INVENTION

In order to attain the above-mentioned objective, the present invention provides an ARC source as defined in claim 1, which allows placing ARC sources forming a denser packing arrangement in order to improve efficiency. Concretely, the ARC source (arc evaporator) according to the present invention comprises:

a cathode assembly comprising a cooling plate 11, a target 1 as cathode element, preferably a disc-shaped target but can be also for example a rectangular target, the target 1 having a thickness in the cross direction, a front surface 1A disposed to be evaporated and a back surface 1B, the front surface 1A being parallel to the back surface 1B, these both surfaces being separated one of each other by the thickness of the target 1, the cathode assembly having a total height in the transversal direction and borders delimiting the total amplitude in any longitudinal direction, an electrode (not shown in FIGS. 6a and 6b) arranged in known manner for enabling that an arc between the electrode and the front surface 1A of the target 1 can be established for causing evaporation of at least part of the front surface of the target 1, and a magnetic guidance system placed in front of the back surface 1B of the target 1 comprising means for generating one or more magnetic fields resulting in a total magnetic field comprising magnetic field lines which extend through the cross section of the target 1 and along the space in front of the front surface 1A of the target 1 for guiding a cathode spot that results from the contact of an arc to the target 1, when the arc is established between the electrode and the front surface 1A of the target 1, wherein:

the borders of the cathode assembly comprise a surrounding shield 15 made of ferromagnetic material, wherein the surrounding shield 15 has a total height H in the transversal direction, said total height H including a component C for causing a shielding effect of magnetic field lines extending in any longitudinal directions, establishing in this manner the borders of the cathode assembly as limit of the extension of the magnetic field lines in any longitudinal direction.

For selecting an appropriate component C of the total height H of the surrounding shield 15, the dimensions of the cathode assembly must be considered.

For example, in the case that the cathode assembly has a symmetrical construction comprising a disc-shaped target with target diameter D1 and the cathode assembly has a total diameter D as it is the case in the example shown schematically in FIG. 6a, then a recommendable value for the component C of the total height H of the surrounding shield 15 can be in the following range: $D/20 \leq C \leq D/5$.

According to a preferred embodiment of the present invention the target diameter is in the following range: 100 mm$\leq$D1$\leq$150 mm, the total diameter of the cathode assembly is in the following range: 150 mm$\leq$D$\leq$200 mm.

Ferromagnetic materials are soft iron materials having high saturation and low remanence. In the context of the present invention some ferromagnetic materials that can be preferably used are pure iron, ARMCO pure iron, construction steel e.g. S235JR or S355J2, martensitic chromium steel e.g. 1.4021. More preferably construction steel S355J2 can be used.

Preferably, the magnetic guidance system in the ARC source comprises means placed in a central region for generating at least one magnetic field and means in a peripherical region for generating at least one further magnetic field, wherein the magnetic fields generated in this manner result in a total magnetic field for guiding the arc and controlling the cathode spot path at the front surface 1A of the target. In this regard, FIG. 6a shows schematically a possible arrangement of means for generation of magnetic fields in the magnetic guidance system corresponding to a preferred embodiment of an ARC source according to the present invention. In this preferred embodiment, the means comprises one electromagnetic coil C3 in the central region for generating a magnetic field and two electromagnetic coils C1 and C2 in the peripherical region for generating two further magnetic fields.

There is not necessary using magnetic guidance systems having only electromagnetic coils or only three electromagnetic coils as means for generation of magnetic fields. It can be also beneficial using permanent magnets and only one electromagnetic coil to be used as control coil for producing variations of the magnetic field characteristics.

According to a further preferred embodiment of the present invention, the magnetic guidance system comprises ferromagnetic material 20 disposed surrounding (or in other words encircling) the means for generation of magnetic field as it is exemplarily shown in FIG. 6a. It can be noted that the ferromagnetic material 20 is distributed encircling the means but no ferromagnetic material 20 is placed between the magnetic guidance system and the cathode assembly.

FIG. 6b shows schematically a further preferred embodiment of the present invention in which the ferromagnetic material 20 is not completely encircling the means for generating the magnetic fields. In this preferred embodiment an upper part with length S of a electromagnetic coil (in this example C3) placed in the central region as well as an upper part with length S' of the electromagnetic coil (in this example C2) placed in the peripherical region but closest to the electromagnetic coil placed in the central region is not encircled by ferromagnetic material 20, resulting in a space Spc comprising air, allowing in this manner that the total magnetic field that results from the sum of the generated magnetic fields exhibits more magnetic field lines that are parallel to the front surface 1A of the target 1 in comparison with a similar arc evaporator without having said space Spc comprising air. By using this preferred embodiment, an upper length S in the following range: 3 mm$\leq$S$\leq$15 mm is recommendable when the target diameter is in the following range: 100 mm$\leq$D1$\leq$150 mm and the total diameter of the cathode assembly is in the following range: 150 mm$\leq$D$\leq$200 mm.

In this manner, it is possible to increase efficiency for example by:

Reducing the distance between cathode material to be vaporized and substrate surface to be coated, i.e. attaining shorter distance substrate to target.

Increasing surface of cathode material to be vaporized, by placing more cathodes, each one closer to each other within an area of a coating chamber wall comprising the cathodes to be vaporized, i.e. attaining denser packing of ARC sources (each arc source placed close and beside to each other).

Increasing flexibility and capability of the used magnetic means for allowing better focusing of the magnetic field, i.e. attaining more focused magnetic field.

Reducing surface of cathode material to be vaporized, in particular reducing target diameter, if circular targets are used, i.e. smaller target diameter.

Allowing placing the substrates to be coated closer to the ARC sources arrangement.

Figure 2:
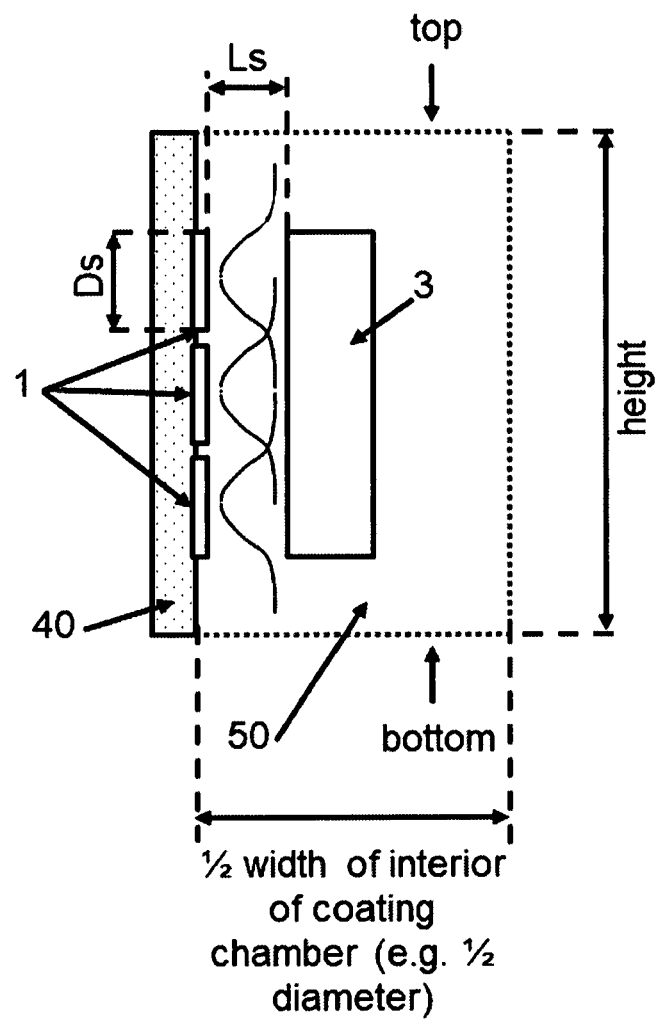

In order to better explain some of the above-mentioned aspects regarding increment of efficiency in the context of the present invention, FIG. 1 and FIG. 2 show two different configurations of coating chambers. In FIG. 1 two circular targets 1 having respectively diameter $D_b$ are placed in the coating chamber at a distance $L_b$ from a substrate 3 to be coated. In FIG. 2 three circular targets 1 having respectively diameter $D_s$ are placed in the chamber separated at a distance Ls from a substrate 3 to be coated. FIG. 2 shows a coating configuration with denser packing of ARC sources because of a shorter distance cathode to cathode and even the possibility of using shorter distances cathode to substrate ($L_b > L_s$), which is in particular possible when also smaller targets diameters are used ($D_b > D_s$). It can be observed for example by looking and comparing the schematical drawings of the configurations shown in FIG. 1 and FIG. 2.

By using the above-mentioned embodiments of ARC sources according to the present invention is possible to overcome the drawbacks of the state of the art and to attain following advantages:

Managing "cross talk" between sources (with the term "cross talk" is meaning magnetic field cross talk, i.e.

magnetic interference between two or more magnetic fields of two or more ARC sources)

Developing a new ARC source having new properties that can anyhow be compatible with available magnetic systems and with available ARC vaporization technologies.

Using targets with smaller diameter (in particular because of difficulties by designing an appropriate anode or anodes and by designing an appropriate magnet system for generating a magnetic field).

Figure 3A:
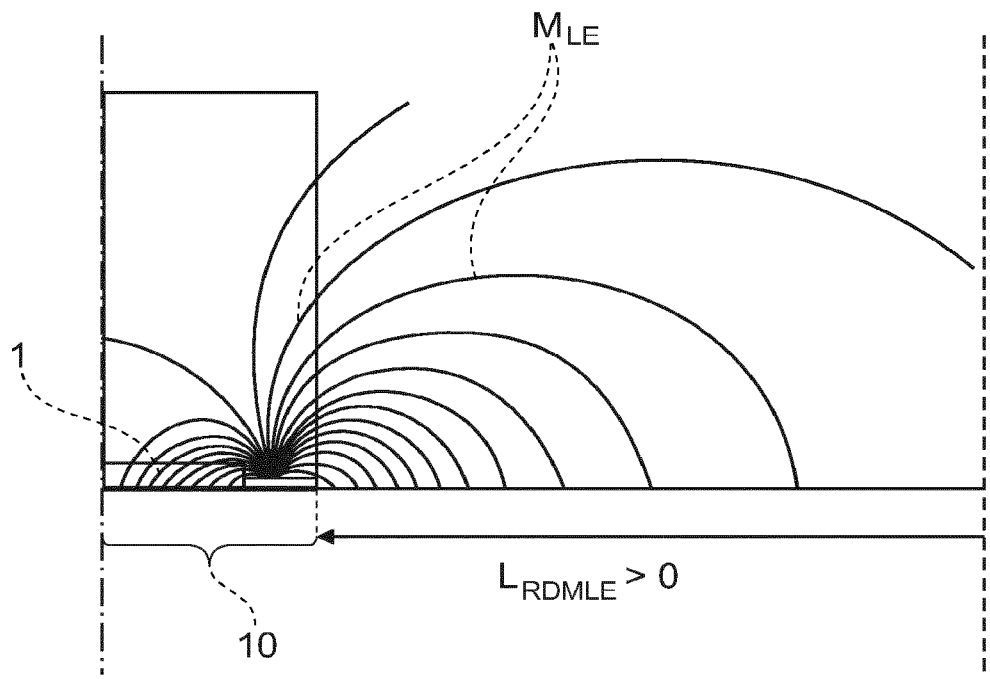
FIG. 3a shows an open magnetic loop according to the state of the art.
Figure 3B:
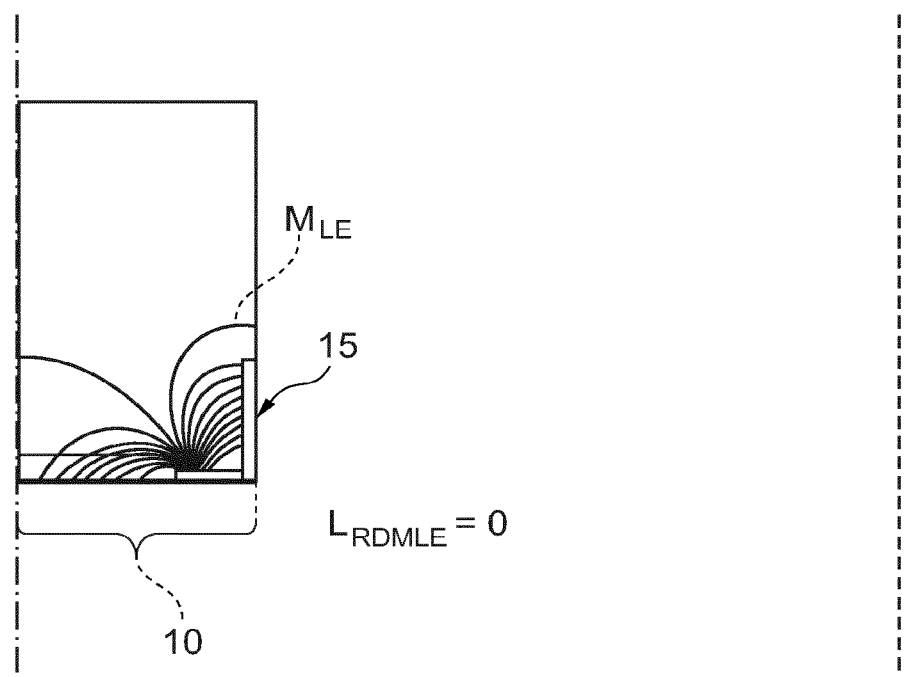
FIG. 3b shows a blocked magnetic field according to the present invention.

Further description of using a surrounding shield (in the context of the present invention also referred to as magnetic shield integrated in high permeability circuit):

The new ARC source according to the present invention enables implementing ARC sources arrangements (also referred to as cathode arrangements) exhibiting narrow source to source distances, by using a blocked magnetic field as it is shown in FIG. 3b.

As already explained above, the blocked magnetic field (hereafter also referred to as shunted magnetic loop) can be attained according to the present invention by providing the ARC source with a soft magnetic material shielding (also referred to as surrounding shield made of ferromagnetic material), for example a soft iron shielding or a low carbon steel shielding. In this manner it is possible that soft magnetic material shunting (e.g. soft iron shunting) of field generating means reduces magnetic interference by more than factor 10. By using inventive ARC sources combining a soft magnetic material shielding as mentioned above (in particular a soft iron shielding or a low carbon steel shielding surrounding the target) and circular targets having smaller diameter, it is possible to allow more dense packing of targets. This combination is also important for axisymmetric anode definition, in particular because in this manner, it is possible to use one or more annular anodes surrounding the circular target and having the same effect in all directions (in other words: symmetrically in all points forming the anode).

FIG. 3 shows a comparison between using an open magnetic loop according to the state of the art (see FIG. 3a) and using a blocked magnetic field according to the present invention (see FIG. 3b).

From this illustrative example, it is clear that using an open magnetic loop, as it is shown in FIG. 3a, it would result in interference with neighbor sources, if the neighbor sources are placed close to each other.

In other words, if a first ARC source is operated by using an open magnetic loop, some magnetic lines will extend along a distance in the radial direction beside the target 1 of the ARC source 10. These magnetic lines will be referred to as exterior magnetic lines, $M_{LE}$, in the context of the present invention and they are exemplarily shown in FIG. 3a. From this example, it is clear that if a neighbor source is placed at a radial distance comprised within the area being occupied with the exterior magnetic lines, $M_{LE}$, of another source, then it would result in an interference with the neighbor source.

In order to better explain the present invention, the radial distance beside an ARC source 10, along which exterior magnetic lines, $M_{LE}$, are extended will be referred to as radial distance comprising exterior magnetic lines and will be denoted as $L_{RDMLE}$, as it is indicated in FIG. 3.

According to the present invention a blocked magnetic field is used, as it is exemplarily shown in FIG. 3b. In this case no exterior magnetic lines, $M_{LE}$, can extend along a large distance in the radial direction beside the ARC source 10, consequently the radial distance comprising exterior magnetic lines is practically zero, $L_{RDMLE}=0$. In this manner it is possible to place two or more sources at a closer radial distance between each other without causing any interference with neighbor sources.

Figure 4:
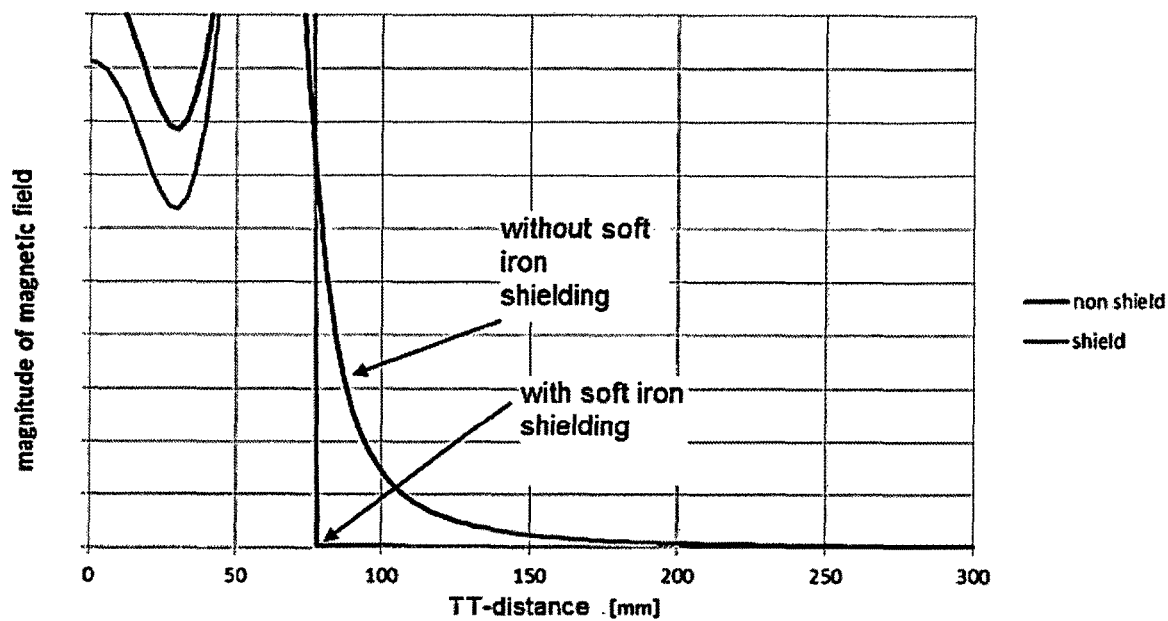
FIG. 4 is a graph of magnetic field lines that were calculated taking into account the conditions generated by using two circular targets.

FIG. 4 shows a graphic of magnetic field lines that were calculated taking into account the conditions generated by using two circular targets, each target having a diameter of 100 mm and the targets being placed at a distance target to target of approximately 150 mm (hereafter the distance target to target will be also referred to as TT-distance—this distance is to be understood as the distance between two neighbor arranged one next to each other in the radial direction, wherein the distance is measured from the center point of one of the two neighbor targets to the center point of the another neighbor target in the radial direction).

In FIG. 4 it is possible to observe the difference in the distribution of the magnitude of magnetic field along the radial direction when ARC sources with open magnetic loop (without soft ion shielding) and inventive ARC sources with shunted magnetic loop (with soft iron shielding) are used. The magnitude of the magnetic field is negligible or completely canceled by effect of the soft iron shielding at a TT-distance lower than 150 mm, when the inventive ARC sources with shunted magnetic loop are used. Contrariwise, the magnitude of the magnetic field is only negligible at a TT-distance of at least 250 mm, when ARC sources with open magnetic loop are used.

The new ARC source according to the present invention can be also designed for allowing high flexibility regarding magnetic field configuration. It means in particular in the context of the present invention that the spatial distribution and field strength is designed so that it can be adjusted independently. In this manner it is possible to obtain a high flexibility regarding high scope of magnet adjustability for the magnetic field in axisymmetric configuration.

Figure 5:
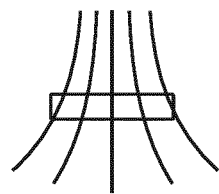
FIG. 5 shows different magnetic fields in axisymmetric configuration scope that can be adjusted with magnet configurations.
Figure 5:
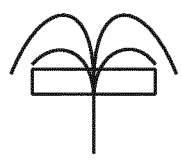
Figure 5:
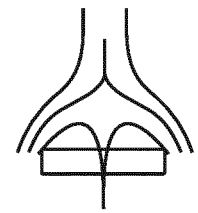
Figure 5:
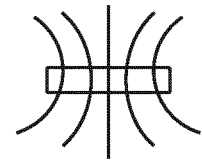
Figure 5:
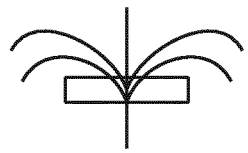
Figure 5:
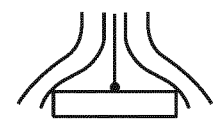
Figure 5:
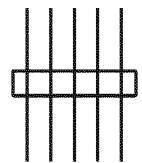
Figure 5:
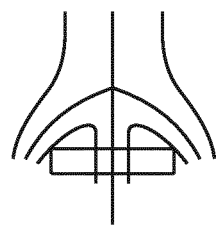
Figure 5:
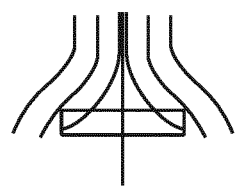

FIG. 5 shows different magnetic fields in axisymmetric configuration scope that can be adjusted with magnet configurations.

Further description of magnetic field generation, in particular by using a magnet system (also referred to as magnetic guidance system) with 3 electromagnetic coils:

Preferably, the inventive ARC source comprises a magnet system comprising electromagnetic coils and soft magnetic materials (also referred to as ferromagnetic material). For this preferred embodiment pure iron is a very suitable soft magnetic material. Also, low carbon steel is suitable as soft magnetic material and even the above-mentioned types of ferromagnetic material are suitable as soft magnetic material for this preferred embodiment.

According to a preferred variant of the preferred embodiment mentioned directly above, the magnet system is made only of electromagnetic coils (hereafter this magnet system will be also referred to as coil system).

Figure 6:
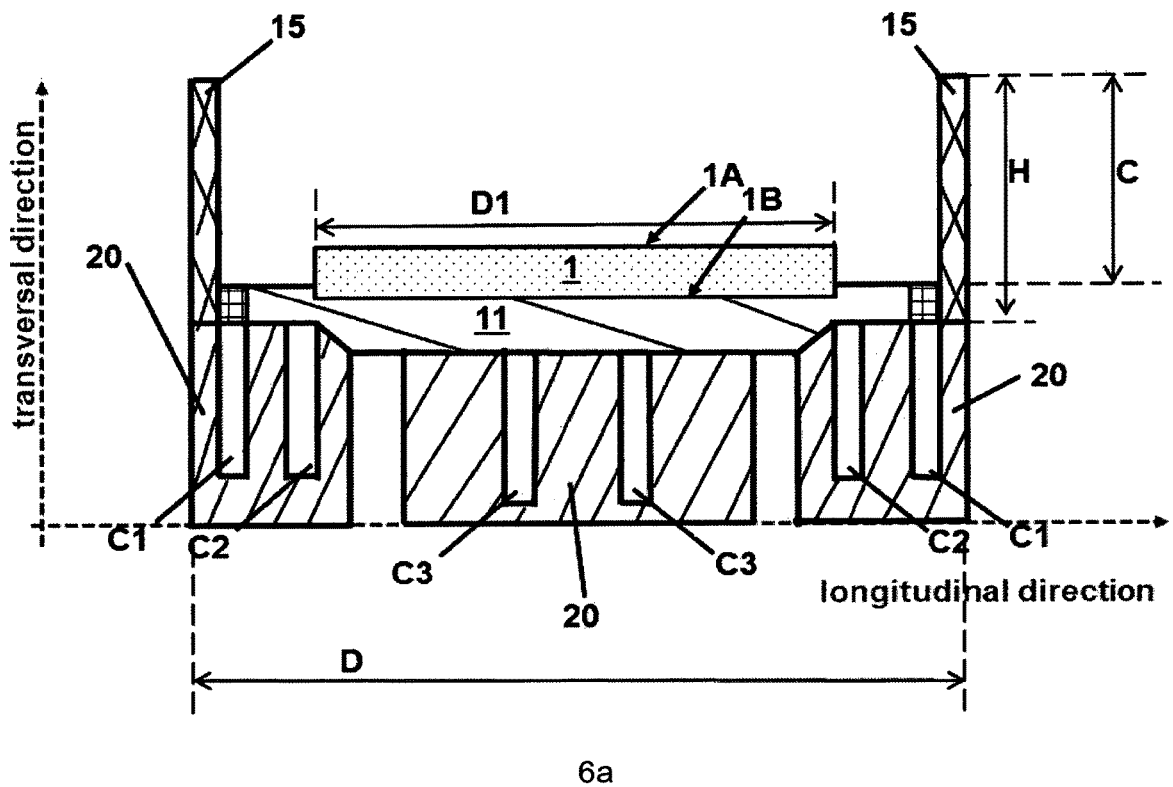
FIG. 6 shows an outlined inventive ARC source; in particular FIG. 6a includes ferromagnetic material disposed surrounding the means for generating magnetic fields, and FIG. 6b includes ferromagnetic material that is not completely encircling the means for generating the magnetic fields.
Figure 6:
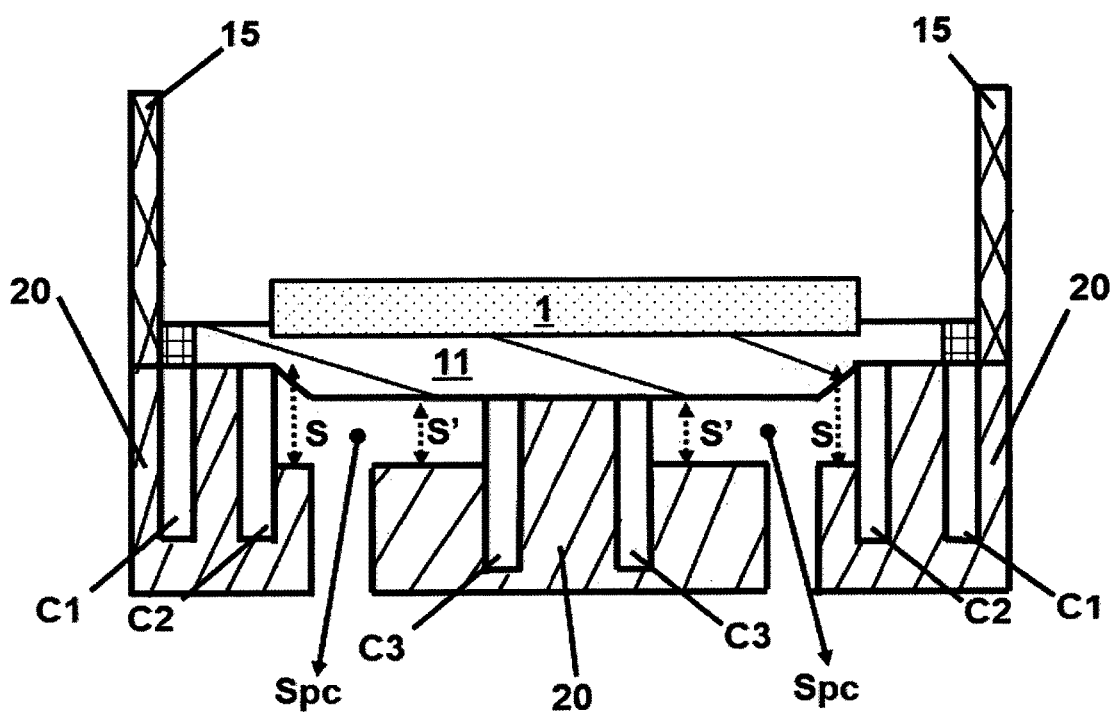

FIG. 6 shows an outlined inventive ARC source 2 according to the directly above mentioned variant. In this variant, two electromagnetic coils, C1 and C2 are used for acting as an outer (peripheral) magnet ring. These two coils, C1 and C2, should be arranged in such a manner that each one can countervail each other. These two coils, C1 and C2, can for example be polarized antiparallel. The relation of C1 to C2 (C1/C2) determines the magnetic focus. The coil system of this variant of an inventive ARC source comprises preferably furthermore a third coil placed in the center area (central region), which has influence on the center of the target and on the magnitude of the magnetic field strength. This coil system can produce the same magnetic field than an equivalent permanent magnet setup and involves the big advantage that the magnetic field strength can be modified without any magnet movement. The electromagnetic coils C1, C2 and C3 are surrounded by soft magnetic material 20, preferably pure ion or low carbon steel.

A soft magnetic material shielding 15 (preferably made of pure ion) is also shown in FIG. 6.

According to a further preferred variant of the preferred embodiment mentioned above, the mentioned magnet system is made of permanent magnets and one electromagnetic coil that is uses as control coil.

In relation to the above described embodiments of the present invention, it is important to take into account that:
 cooling of coil setup is required and
 soft magnetic material must have high saturation flux-density and low remanence.

Figure 7:
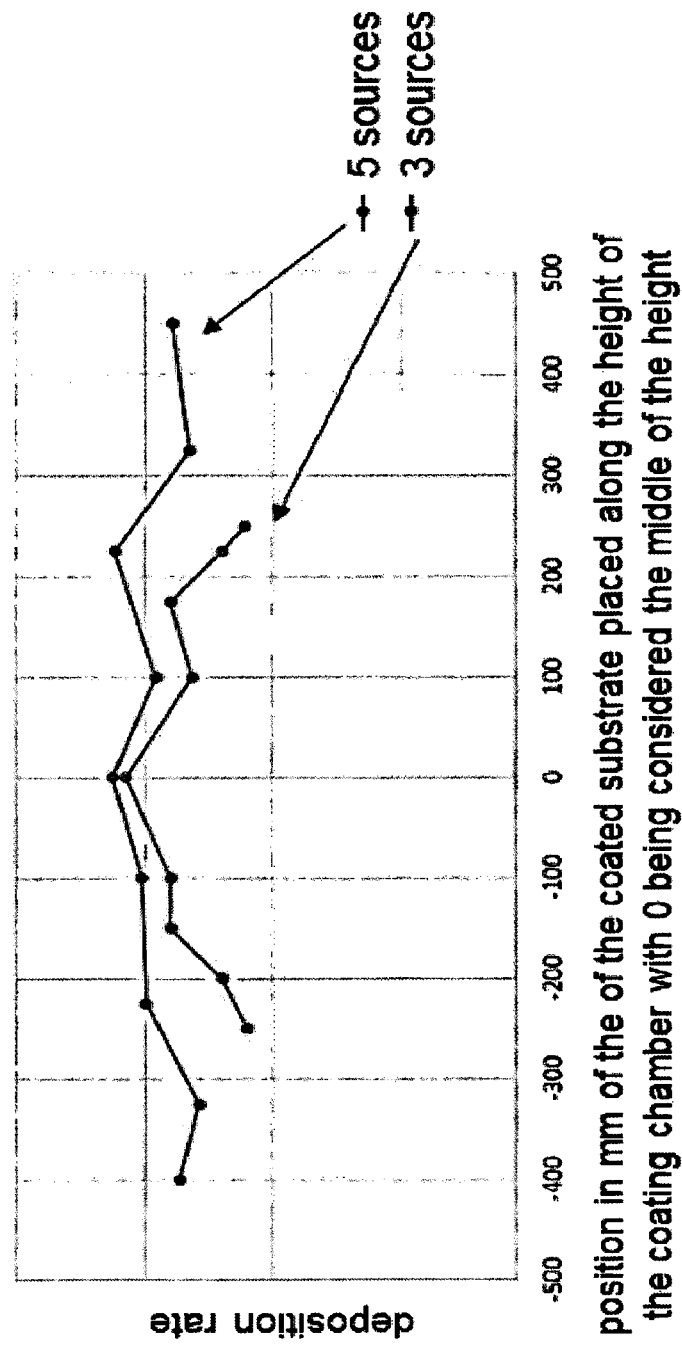
FIG. 7 is a graph showing high uniformity regarding deposition rate of AlTiN coatings.

FIG. 7 shows the high uniformity regarding deposition rate (in arbitrary units) of AlTiN coatings deposited by using 5 inventive ARC sources distributed in a denser packing distribution along the height of a wall of a coating chamber in comparison with using 3 inventive ARC sources distributed along the height of the same wall of the same coating chamber. Same coating parameters where used in both cases in order to make possible the comparison. It can be observed that a high uniformity can be attained in both cases, but especially higher uniformity (i.e. lower non-uniformity of <±10%) was attained by using a higher quantity of ARC sources, in this case by using 5 ARC sources.

Figure 8:
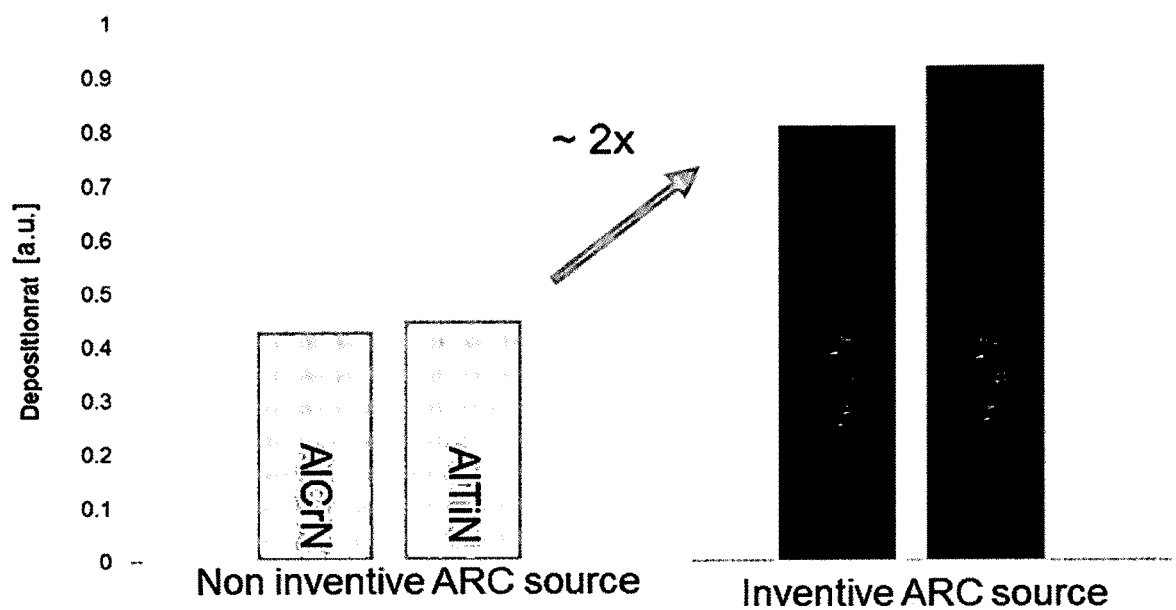
FIG. 8 shows a comparison between deposition rates.

FIG. 8 shows a comparison between deposition rates (in arbitrary units), by using a coating arrangement comprising non-inventive ARC sources and by using a coating arrangement comprising inventive ARC sources. The rate was considered per coating line. An increment of the deposition rate by a factor of approximately 2 was attained by using the arrangement with the inventive ARC sources.

Figure 9:
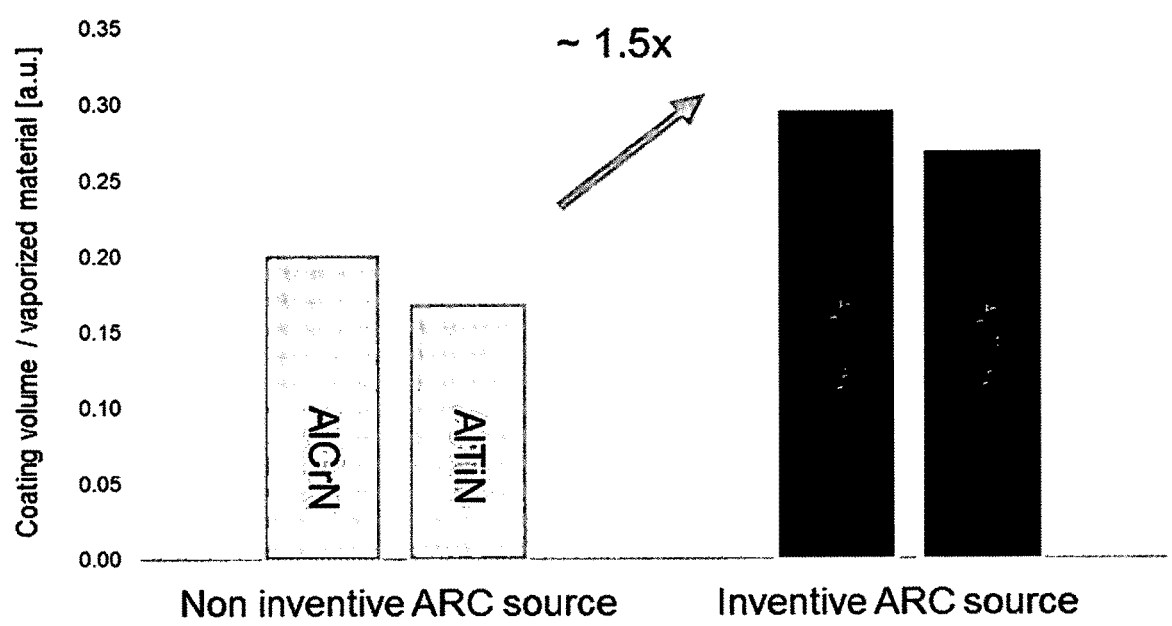
FIG. 9 shows a comparison between coating efficiency.

FIG. 9 shows a comparison between coating efficiency calculated regarding coating volume/vaporized material, by using a coating arrangement comprising non-inventive ARC sources and by using a coating arrangement comprising inventive ARC sources. An increment of approximately 50% in the utilization of material vaporized from the target was attained by using the arrangement with the inventive ARC sources. It means that from the material vaporized from the target, approximately 50% more was deposited in the substrate surface to be coated by using the inventive ARC sources.

The results shown in FIG. 8:
 For the non-inventive examples: 2 non-inventive ARC sources, each one comprising a target having diameter of 150 mm and being operated by using an arc current of 150 A, the 2 non-inventive ARC sources being arranged along a height of the wall of the coating chamber of 400 mm.
 For the inventive examples: 3 inventive ARC sources, each one comprising a target having diameter of 150 mm and being operated by using an arc current of 150 A, the 3 inventive ARC sources being arranged along a height of the wall of the coating chamber of 500 mm.

Since 3 inventive ARC sources were used instead of 2 non-inventive ARC sources, it was expected and increment of 1, 5 times in the deposition rate, however, the increment was considerably higher because it was of about 2 times. These results provide evidence of the considerable advantage in efficiency that can be attained by using ARC sources according to the present invention.

The results shown in FIG. 9:
 For the non-inventive examples: 2 non-inventive ARC sources, each one comprising a target having diameter of 150 mm and being operated by using an arc current of 200 A, the 2 non-inventive ARC sources being arranged along a height of the wall of the coating chamber of 400 mm.
 For the inventive examples: 3 inventive ARC sources, each one comprising a target having diameter of 150 mm and being operated by using an arc current of 200 A, the 3 inventive ARC sources being arranged along a height of the wall of the coating chamber of 500 mm.

In each case (i.e. when using non-inventive ARC sources and when using inventive ARC sources) the efficiency was determined by calculating the relation of coating volume divided by total vaporized material. For the calculation the total volume of the coating deposited on the coated substrates and the total material vaporized from the targets were determined. The total material vaporized was determined by measuring the erosion in each target after coating and adding the eroded volume corresponding to vaporized material for each respective target. An increment of about 1, 5 times was obtained by using the inventive ARC sources. These results provide evidence of the considerable advantage in efficiency that can be attained by using ARC sources according to the present invention.

Summary of the Most Important Advantages Provided by Using ARC Sources According to the Present Invention:

By selection of one or more attributes for construction of new and innovative ARC sources as described above it is possible to attain respectively one or more of the following objectives:
 High efficiency and productivity.
 High flexibility in magnetic field variations.
 Working efficiently within a reactive atmosphere irrespective of reactive gas is gas ionized or low ionized, e.g. if high ionized nitrogen gas or low ionized nitrogen gas is required.
 Flexibility for deposition of any kind of coating e.g. nitride, oxide, carbide or combinations thereof.
 Reduction of operation costs by increasing overall efficiency during operation of the ARC source, in particular by:
  Increasing energy efficiency
  Increasing efficiency related to maximum utilization of coating material vaporized from the cathode material
  Increasing coating film deposition rate

The invention claimed is:

1. An ARC evaporator comprising:
 a cathode assembly comprising a cooling plate, a target as cathode element, the target having a thickness in a cross direction, a front surface disposed to be evaporated, and a back surface, the front surface being parallel to the back surface, the front surface and the back surface being separated from each other by a thickness of the target, the cathode assembly having a total height in a transversal direction and borders delimiting a total amplitude in any longitudinal direction,
 an electrode arranged for enabling an arc to be established between the electrode and the front surface of the target for causing evaporation of at least part of the front surface of the target, and
 a magnetic guidance system placed in front of the back surface of the target comprising means for generating one or more magnetic fields resulting in a total magnetic field comprising magnetic field lines which extend through a cross section of the target and along a space in front of the front surface of the target for guiding a cathode spot that results from contact of an arc to the target, when the arc is established between the electrode and the front surface of the target, wherein the borders of the cathode assembly comprise a surrounding shield made of ferromagnetic material, wherein the surrounding shield has a total height in the transversal direction, said total height including a component (C) measured in the transversal direction from the cooling plate to an end of the surrounding shield, wherein the end of the surrounding shield exceeds the cooling plate in the transversal direction, wherein the component (C) causes a shielding effect of magnetic field lines extending in any of the longitudinal directions, establishing in this manner the borders of the cathode assembly as a limit of the extension of the magnetic field lines in any longitudinal direction, and wherein the cathode assembly has a symmetrical construction comprising a disc-shaped target with a target diameter (D1) and the cathode assembly has a total diameter (D), wherein the target diameter is in the following range: 100 mm≤D1≤150 mm and the total diameter of the cathode assembly is in the following range: 150 mm≤D≤200 mm, and the component (C) has a value in the following range: D/20≤C≤D/5.

2. An ARC evaporator according to claim 1, wherein the ferromagnetic material is pure iron or ARMCO pure iron or construction steel or martensitic chromium steel.

3. An ARC evaporator according to claim 2, wherein the ferromagnetic material is construction steel S355J2.

4. An ARC evaporator according to claim 1, wherein the magnetic guidance system in the ARC evaporator comprises means placed in a central region for generating at least one magnetic field and means in a peripherical region for generating at least one further magnetic field, wherein the magnetic fields generated in this manner result in a total magnetic field for guiding the arc and controlling the cathode spot path at the front surface of the target.

5. An ARC evaporator according to claim 4, wherein the means placed in the central region comprises one electromagnetic coil for generating a magnetic field and the means placed in the peripherical region comprises two electromagnetic coils for generating two further magnetic fields.

6. An ARC evaporator according to claim 4, wherein the means for generating the magnetic fields comprises permanent magnets and only one electromagnetic coil to be used as a control coil for producing variations of the magnetic field characteristics.

7. An ARC evaporator according to claim 1, wherein the magnetic guidance system comprises ferromagnetic material disposed surrounding the means for generation of the magnetic field, wherein the ferromagnetic material is distributed encircling the means with no ferromagnetic material placed between the magnetic guidance system and the cathode assembly.

8. An ARC evaporator comprising:
a cathode assembly comprising a cooling plate, a target as cathode element, the target having a thickness in a cross direction, a front surface disposed to be evaporated, and a back surface, the front surface being parallel to the back surface, the front surface and the back surface being separated from each other by a thickness of the target, the cathode assembly having a total height in a transversal direction and borders delimiting a total amplitude in any longitudinal direction, an electrode arranged for enabling an arc to be established between the electrode and the front surface of the target for causing evaporation of at least part of the front surface of the target, and a magnetic guidance system placed in front of the back surface of the target comprising means for generating one or more magnetic fields resulting in a total magnetic field comprising magnetic field lines which extend through a cross section of the target and along a space in front of the front surface of the target for guiding a cathode spot that results from contact of an arc to the target, when the arc is established between the electrode and the front surface 1A of the target, wherein the magnetic guidance system comprises means placed in a central region comprising one electromagnetic coil for generating a magnetic field and means in a peripheral region comprising two electromagnetic coils for generating two further magnetic fields, wherein the magnetic fields generated in this manner result in a total magnetic field for guiding the arc and controlling the cathode spot path at the front surface of the target, wherein the borders of the cathode assembly comprise a surrounding shield made of ferromagnetic material, wherein the surrounding shield has a total height in the transversal direction, said total height including a component (C) for causing a shielding effect of magnetic field lines extending in any of the longitudinal directions, establishing in this manner the borders of the cathode assembly as a limit of the extension of the magnetic field lines in any longitudinal direction, and wherein the magnetic guidance system comprises ferromagnetic material disposed surrounding the means for generation of the magnetic field, wherein the ferromagnetic material is distributed partially encircling the means but no ferromagnetic material is placed between the magnetic guidance system and the cathode assembly, wherein an upper part with length (S) of the electromagnetic coil placed in the central region as well as an upper part with length S' of the electromagnetic coil placed in the peripheral region but closest to the electromagnetic coil placed in the central region is not encircled by ferromagnetic material, resulting in a space comprising air, allowing in this manner that the total magnetic field that results from the sum of the generated magnetic fields exhibits more magnetic field lines that are parallel to the front surface of the target in comparison with a similar arc evaporator without having said space comprising air.

9. An ARC evaporator according to claim 8, wherein the upper length (S) is in the following range: 3 mm≤S≤15 mm, the target diameter (D1) is in the following range: 100 mm≤D1≤150 mm and the total diameter (D) of the cathode assembly is in the following range: 150 mm≤D≤200 mm.

* * * * *